United States Patent [19]

Cassidy et al.

[11] 4,389,771  
[45] Jun. 28, 1983

[54] TREATMENT OF A SUBSTRATE SURFACE TO REDUCE SOLDER STICKING

[75] Inventors: Michael P. Cassidy, Ewing Township, Mercer County; John F. D'Amico, Montgomery Township, Somerset County; Michael A. DeAngelo, Jr., Ewing Township, Mercer County; Kon-Mang Lin, Hopewell Township, Mercer County, all of N.J.

[73] Assignee: Western Electric Company, Incorporated, New York, N.Y.

[21] Appl. No.: 222,442

[22] Filed: Jan. 5, 1981

[51] Int. Cl.³ .............................................. H05K 3/02
[52] U.S. Cl. ....................................... 29/846; 29/825; 174/68.5; 228/215; 427/96
[58] Field of Search .......................... 29/846, 847, 825; 174/68.5; 228/162, 203, 215; 427/96

[56] References Cited

U.S. PATENT DOCUMENTS

| | | |
|---|---|---|
| 1,899,068 | 2/1933 | Walsh et al. |
| 2,421,079 | 5/1947 | Narcus |
| 2,599,710 | 6/1952 | Hathaway |
| 3,339,008 | 8/1967 | MacArthur et al. ........... 228/215 X |
| 3,343,976 | 9/1967 | Matlock |
| 3,546,009 | 12/1970 | Schneble, Jr. et al. ........ 174/68.5 X |
| 3,610,811 | 10/1971 | O'Keefe ............................. 174/68.5 |
| 3,851,223 | 11/1974 | Yonezuka et al. ............. 174/68.5 X |
| 3,915,809 | 10/1975 | Wheatley |

OTHER PUBLICATIONS

"Printed Circuit Techniques" by R. J. Ryan in RCA Technical Notes, No. 768, Apr., 1968.

Primary Examiner—Lowell A. Larson  
Assistant Examiner—Carl J. Arbes  
Attorney, Agent, or Firm—J. F. Spivak

[57] ABSTRACT

A method for preventing solder sticking on printed circuit substrates comprises mechanically roughening the surface of the substrate.

5 Claims, 3 Drawing Figures

TREATMENT OF A SUBSTRATE SURFACE TO REDUCE SOLDER STICKING

TECHNICAL FIELD

This invention relates to the manufacture of printed circuits and more particularly to the prevention of solder sticking on the circuit substrate.

BACKGROUND OF THE INVENTION

Substrates used in printed circuit boards are generally comprised of polymeric coatings over a base material. The substrates may be rigid or flexible. Typical base materials used in the industry may be metallic or nonmetallic such as steel or fiberglass mesh respectively. In the case of flexible circuits, base materials are generally very thin and the coating applied thereon is also very thin so as to allow for flexibility of the printed circuit substrate. Other substrates are also known in the art.

Typical coatings over the base materials for these printed circuits include phenolic resins, phenolic-rubber resin, ABS and various epoxy resins. It has been found, especially with the use of epoxy resins, that in certain instances, especially with flexible circuit boards having epoxy coatings for the substrate, a problem exists which may be termed solder sticking.

During the manufacture of a printed circuit assembly on a printed circuit substrate, solder is generally caused to be flowed over the substrate surface after the formation of the circuit pattern thereon. This solder can be flowed over the surface during the final stages of printed circuit manufacture, such as in the roll-tinning or hot-gas solder leveling processes or can be applied during assembly of the printed circuit board with its associated electronic components in the wave soldering, solder dipping or drag soldering operations. All of the above soldering techniques are well known in the art. Ordinarily, the solder sticks only to the metallic circuit pattern applied to the substrate. However, occasionally solder is found to stick on the substrate in areas between the circuit pattern. If the solder sticking is extensive or occurs between closely spaced circuit lines, a short or leakage path may occur in the circuit. This problem especially manifests itself in the newer circuit board technology wherein spacing between lines is often kept at a minimum.

There have been various efforts to control solder sticking involving many approaches including modifying the solder or soldering parameters, fluxes and the like. We have discovered that a technique which is generally employed and related to improving adhesion, can unexpectedly be used to prevent adhesion or sticking of solder. The technique referred to is that of roughening the surface onto which the material is to be coated. Generally, the literature teaches that adhesion of a coating on a surface is improved by roughening of the surface. This would normally lead one away from the use of such a technique for the prevention of adhesion or sticking of a material to a surface.

SUMMARY OF THE INVENTION

The novel process involves mechanically roughening the surface of an epoxy coated circuit board with either a grinding or blasting compound having a grit size of from 125 to 400 mesh or with a polishing pad which will give equivalent roughening to that of such a grit. The substrate can be processed subsequent to roughening in its usual manner.

DETAILED DESCRIPTION

Figure 1:
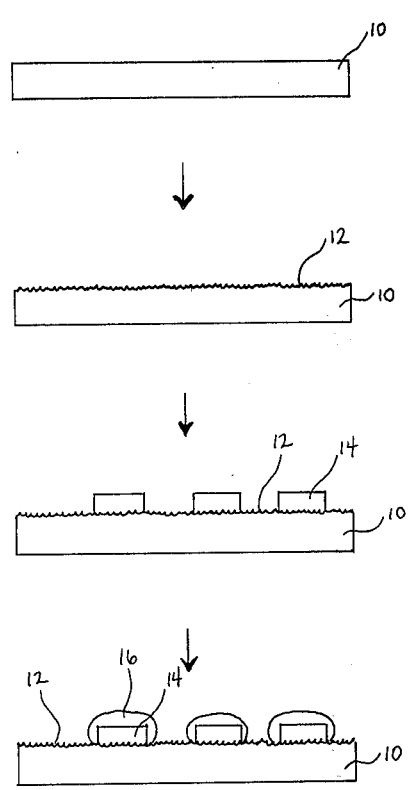
FIG. 1 indicates the process steps using the novel roughening technique during additive processing of a printed circuit board.

Referring to FIG. 1 there is shown a substrate 10 for a printed circuit board. The substrate 10 comprises a flexible glass or metal having an epoxy coating thereon. Where the flexibility of the substrate is to be maintained, it is preferred to use an epoxy resin which has been rubber modified so as to sustain flexibility. Suitable formulations for epoxy coated printed circuit boards can be found with reference to U.S. Pat. Nos. 4,077,927, 4,091,127 or 4,121,015 issued to C. A. McPherson. In accordance with one embodiment of the invention, the substrate 10 is roughened on at least one surface 12 thereof, preferably by means of a silicon carbide sanding or emory paper having a grit size of from 125 to 400, or by aluminum oxide abrasive blasting having the same grit size. Other grit materials or mechanical roughening materials such as a Scotch Bright ® polishing pad available from 3M Company are suitable provided that they give equivalent roughening of the surface to the 125 to 400 grit size sanding material. It should be noted, however, that it was unexpectedly found that chemical roughening of the surface, i.e. by chemical etching techniques, does not result in a significant reduction of solder sticking. Consequently, the roughening in accordance with this invention is limited to mechanical roughening techniques. One may roughen the entire surface 12 as shown in FIG. 1 or alternately, during the roughening process one may apply a mask such as a steel or chromium mask to the surface and only roughen those areas on which a circuit pattern is not to be applied. Subsequent to roughening of the surface the substrate is then sensitized, catalyzed and an electrolessly deposited metal circuit pattern 14 is applied thereto by any of the well known and commercially available techniques. By way of example of such techniques one may make reference to the following U.S. Pat. Nos. 4,100,037, 4,181,750, 3,894,163, and Re. 29,015. Subsequent to the deposition of the desired electroless circuit pattern 14 on the roughened substrate surface 12, one may build up the circuit pattern by electroplating prior to applying solder thereto or one may apply solder directly over the electrolessly plated circuit pattern. One method of applying solder to the circuit pattern is by the well known wave soldering method. In this method the printed circuit board having a circuit pattern thereon including components and flux is passed over a fountain of molten solder and upon removal, the solder 16 sticks only to the electrolessly placed surface and not to the unplated portions of the circuit board. Without roughening as taught by the applicants, it is often found that spurious solder sticking occurs on nonplated portions of the circuit board.

While the roughening step is particularly useful in additive processing as set forth above, it may be useful in subtractive processing techniques as well where the substrate surface is smooth. However, one should be aware that substrates used for laminating metal foil thereon as employed in subtractive processing are often rough to begin with to promote adhesion of the metal laminate. In such cases no further roughening may be necessary to avoid solder sticking.

Figure 2:
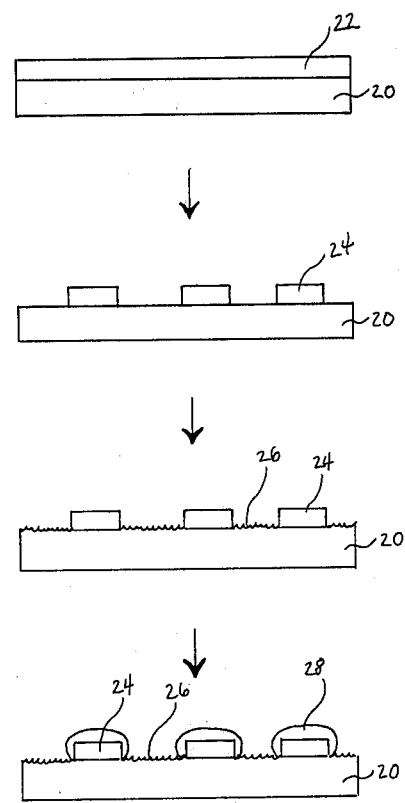
FIG. 2 shows the process steps for manufacturing a printed circuit employing subtractive processing steps and including the novel roughening step in the process.

FIG. 2, depicts a method of making a printed circuit board 20 which incorporates the step of roughening while employing the well known subtractive process for manufacturing such circuit boards. In this process a substrate 20 which has a copper or other metal laminate 22 on at least one surface thereof is treated by means of masks and photoresist followed by etching solutions to etch away selective portions of the copper laminate as is well known in the art so as to provide the desired circuit pattern 24. Thereafter, the exposed substrate surface 26 may be roughened, preferably while protecting the circuit pattern with a mask, thereafter solder 28 can be safely flowed over the circuit pattern 24.

Figure 3:
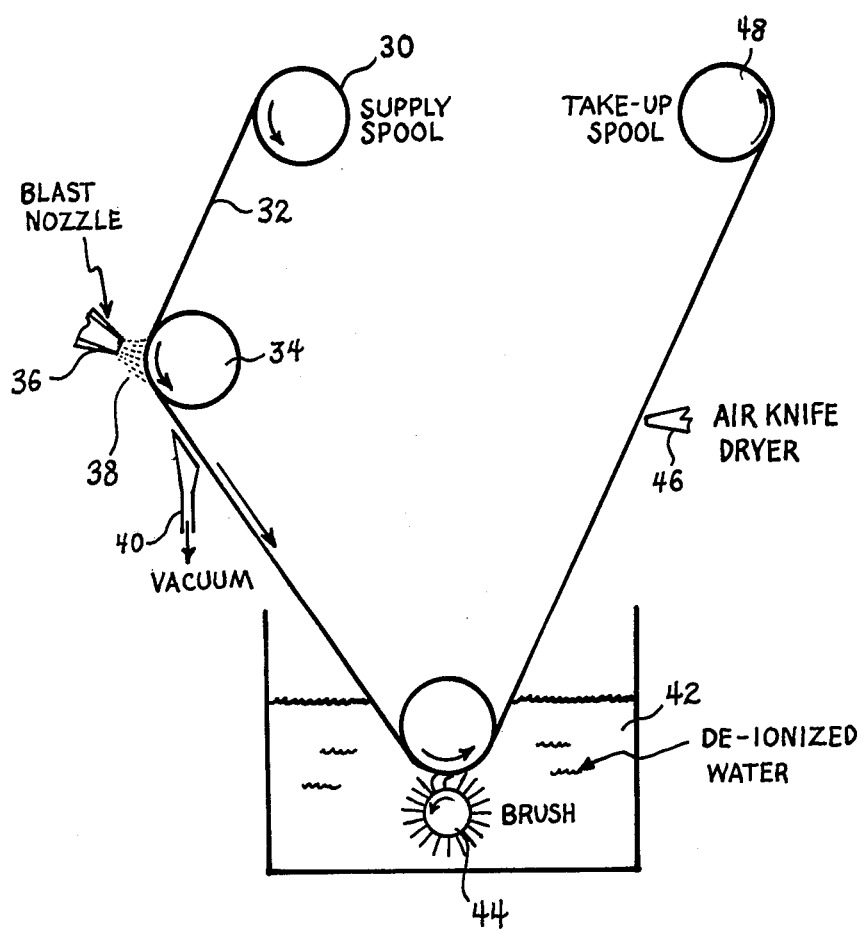
FIG. 3 is a schematic view of an apparatus for roughening a flexible substrate.

It should be understood that while the solder sticking problem has been found to be most prevalent with flexible epoxy coated circuit boards made by additive processing, the roughening to avoid solder sticking is not necessarily limited to epoxy coated boards or to flexible boards. It may also be pointed out that it is preferred, due to the ease of processing, to blanket roughen the entire surface of the printed circuit board as depicted in FIG. 1 herein, rather than selectively roughen the board through a mask. A preferred roughening technique for flexible substrates is that of blasting the substrate surface with a grit ejected through a high pressure nozzle. The nozzle is fixed in place while moving a substrate web past the nozzle from a supply reel to a take-up reel. This technique can best be seen by reference to FIG. 3. FIG. 3 shows a supply spool 30 containing a flexible epoxy-glass substrate web 32 fed over a guide roller 34 in front of a blast nozzle 36. The web is then fed past a vacuum nozzle 40 for collecting the abrasive grit 28 emitted from the nozzle 36 and through a deionized water bath 42 having a motor driven brush 44 therein for removing any remaining abrasive material 38. Thereafter the web is dried by means of an air knife 46 and collected on a take-up spool 48. It should be realized that the amount of roughening which may be applied, within the range of grit sizes as specified herein is such that where high density printed circuit lines and spaces are necessary, the finer grit size within the specified range is preferred for the sanding method while coarser grit size is preferred for abrasive blasting.

What is claimed is:

1. A method of manufacturing a printed circuit comprising the steps of:
    (a) forming a circuit pattern on a flexible rubber modified epoxy coated printed circuit substrate;
    (b) mechanically roughening at least that portion of the substrate not having or not to have a circuit pattern thereon either before or after the formation of said pattern by means which result in roughening equivalent to roughening with a 125-400 mesh grit; and
    (c) flowing solder over the circuit board so as to cause solder to coat only the circuit pattern.

2. The method recited in claim 1 wherein the substrate is roughened prior to formation of a circuit pattern thereon, said pattern being formed by additive processing.

3. The method recited in claim 2 wherein the entire surface is roughened.

4. The method recited in claim 2 wherein mechanical roughening is achieved by means of a sanding or a blasting material having a grit size of from 125-400 mesh.

5. The method recited in claim 1 wherein the substrate is a metal clad material, the circuit pattern is formed by subtractive processing and the exposed areas of the substrate are roughened subsequent to circuit pattern formation.

* * * * *